United States Patent [19]

Mizutani et al.

[11] Patent Number: 5,284,544
[45] Date of Patent: Feb. 8, 1994

[54] APPARATUS FOR AND METHOD OF SURFACE TREATMENT FOR MICROELECTRONIC DEVICES

[75] Inventors: Tatsumi Mizutani, Koganei; Takashi Yunogami, Kokubunji, both of Japan

[73] Assignee: Hitachi, Ltd., Tokyo, Japan

[21] Appl. No.: 599,018

[22] Filed: Oct. 17, 1990

[30] Foreign Application Priority Data

Feb. 23, 1990 [JP] Japan .................. 2-041004

[51] Int. Cl.$^5$ .............................. H01L 21/00
[52] U.S. Cl. .................... 156/345; 156/643; 427/589; 427/575; 118/723 FI; 118/723 R; 118/723 MW; 118/723 I; 204/298.04; 204/298.34; 204/298.36
[58] Field of Search ............... 156/345, 643; 427/39; 204/298.34, 298.36, 298.04; 118/723

[56] References Cited

U.S. PATENT DOCUMENTS

| | | | |
|---|---|---|---|
| 4,450,031 | 5/1984 | Ono et al. | 204/298.36 |
| 4,532,199 | 7/1985 | Ueno et al. | 118/723 |
| 4,624,214 | 11/1986 | Suzuki et al. | 156/345 |
| 4,668,337 | 5/1987 | Sekine | 156/345 |
| 4,678,681 | 7/1987 | Obayashi et al. | 427/296 |
| 4,687,544 | 8/1987 | Bersin | 156/345 |
| 4,761,199 | 8/1988 | Sato | 156/345 |
| 4,778,561 | 10/1988 | Ghambari | 156/345 |
| 4,869,780 | 9/1989 | Yang et al. | 156/345 |
| 4,956,043 | 9/1990 | Kanetomo et al. | 204/298.31 |

FOREIGN PATENT DOCUMENTS

| | | |
|---|---|---|
| 0184220 | 6/1986 | European Pat. Off. . |
| 0283519 | 9/1988 | European Pat. Off. . |
| 59-098478 | 6/1984 | Japan . |
| 61-141141 | 6/1986 | Japan . |
| 61-144827 | 7/1986 | Japan . |
| 62-033422 | 2/1987 | Japan . |
| 62-122219 | 6/1987 | Japan . |
| 63-311365 | 12/1988 | Japan . |
| 64-087789 | 3/1989 | Japan . |
| 1-105460 | 4/1989 | Japan . |
| 2-044720 | 2/1990 | Japan . |

OTHER PUBLICATIONS

Journal Of Electrochemical Society, Solid-State Science and Technology, vol. 126, Jun. 1979, pp. 1024-1028, Manchester, US; K. Suzuki et al. "The roles of ions and neutral active species in microwav plasma etching".

Japanese Journal Of Applied Physics, B-1-2, 1989; 21st Conference On Solid State Devices And Materials, Tokyo, 28-30 Aug. 1989, pp. 153-156; K. Nojiri et al.: "Microwave plasma etching of silicon dioxide for half-micron ULSIs".

"Directional Reactive Ion Etching at Oblique Angles"; by Boyd et al.; Appl. Phys. Lett. 36(7), pp. 583-585.

*Primary Examiner*—Brian E. Hearn
*Assistant Examiner*—George Goudreau
*Attorney, Agent, or Firm*—Antonelli, Terry, Stout & Kraus

[57] ABSTRACT

An apparatus for surface treatment according to the present invention used for carrying out dry etching, thin film deposition and so forth is provided with a neutral beam etching apparatus in order to improve etching rate. In an embodiment, microwave waveguides forming a duplex tube, a discharge tube, a pair of solenoids arranged coaxially, a multiaperture electrode for extracting an ion beam, gas supply pipes, a set of charged particle retarding grids, a device for controlling temperature of a specimen and a vacuum unit are provided.

53 Claims, 7 Drawing Sheets

APPARATUS FOR AND METHOD OF SURFACE TREATMENT FOR MICROELECTRONIC DEVICES

BACKGROUND OF THE INVENTION

The present invention relates to an apparatus for and a method of surface treatment for carrying out dry etching, surface cleaning, thin film deposition and the like, and more particularly to an apparatus for and a method of surface treatment suitable for pattern delineation of microelectronic devices such as semiconductor integrated circuits.

Surface treatment techniques such as etching, surface cleaning and deposition utilizing plasma have ben widely used in fabrication processes for electronic devices such as semiconductor integrated circuits in recent years.

These techniques are called dry processes in general, and claimed advantages exist in that surface treatment is possible at low temperatures, the processes are able to delineate very fine patterns, and so forth. Particularly, the dry etching technique is an indispensable technique for delineating very fine patterns of semiconductor integrated circuits, in that pattern delineation on thin film materials can be done without pattern width shift from the mask width by making the most of directional movement of ions from plasma.

In such a process utilizing plasma, however, various radiation damage is are caused on a specimen because of the facts that the energy of particles which are incident on the specimen is high, particles have electric charge, and so forth.

In particular, a problem of degradation of a thin insulating film is caused by an electric charge of particles that is accumulated on a specimen surface and a large current flows further in an element and a thin film in the specimen is a serious problem attended with plasma treatment as reported in "Solid State Technology", 27 (1984) pp. 263–266 and "Extended Abstracts of the 19th Conference on Solid State Devices and Materials", Tokyo (1987) pp. 195–198. This problem becomes more and more important because an insulating film constituting an element becomes very thin with the development of refinement of elements for the future.

Degradation of an insulating film by means of a plasma process as described above is generated because a large quantity of charged particles such as ions and electrons are incident on a specimen from plasma.

Therefore, the present inventor et al. have developed a technique of carrying out etching with a neutral beam without having charged particles be incident on a specimen surface by an apparatus and a method disclosed in JP-A-61-248428 and JP-A-62-259443.

In this system, an ion beam extracted from plasma by accelerating to desired kinetic energy, e.g., several hundred eV, is made to pass through a gas at $10^{-2}$–$10^{-4}$ Torr, a part of the ion beam is converted into a neutral beam by charge exchange reactions with atoms and molecules in the gas, residual ions are repelled to proceed by means of appropriate electric field or magnetic field which is applied in front of the specimen, and only the neutral beam is radiated onto the specimen.

A gas containing halogen such as $Cl_2$ is supplied at the same time so as to be adsorbed on the specimen surface. Thus, a chemical reaction between halogen and a surface material is proceeded at a location where a neutral beam at several hundred eV is radiated and etching of the surface can be proceeded by converting the surface material into a volatile material such as halide.

Since only electrically neutral particles are incident on the specimen in a system described above, it has been confirmed that almost no charge build-up is produced on the surface and thus almost no degradation in breakdown voltage of a thin insulating film contained in a semiconductor element and the like is generated.

Etching can be applied to variety of materials such as Si, $SiO_2$, $Si_2N_4$, $WSi_2$, TiN and Al forming semiconductor integrated circuits by this method.

Rare gas atoms such as Ne and Ar may be used principally as a neutral beam, and an appropriate gas may be selected among $Cl_2$, $F_2$, $XeF_2$, $CCl_4$, $NF_3$, $BCl_3$ and so on depending on a material to be etched as a reactive gas supplied to the specimen surface.

Since etching reaction is proceeded only at a location irradiated with a neutral beam, etching is applied along a direction of the neutral beam and highly precise pattern delineation can be realized without etching pattern width shift.

As a result of study for putting neutral beam etching described above to practical use, following problems have been revealed.

A first problem is that the etching rate is very low. For example, in case Si was etched with a neutral beam of Ar and a $Cl_2$ gas, the etching rate was 30 nm/min at most, and when $SiO_2$ was etched with a neutral beam of Ar and a $CHF_3$ gas, the etching rate was about 10 nm/min.

These values are one to two orders of magnitude smaller as compared with an etching rate by a plasma etching technique employed in a present fabrication process of semiconductor integrated circuits, and this technology cannot be adopted as it is as a production technology in mass-production.

Incidentally, a technology in which a gas composed of molecules containing halogen is formed into plasma by glow discharge in advance outside of a vacuum chamber of an apparatus for surface treatment and fragment molecules and radicals in the ga which has been formed into plasma are introduced proximately to a specimen has been disclosed in JP-A-62-291032 by the present inventor et al.

It has also been disclosed in this official gazette that the surface reaction of the specimen is enhanced by introducing fragment molecules and radicals proximately to the specimen.

As to the contents disclosed therein, however, the present inventor has found that enhancement of the surface reaction of the specimen is not necessarily sufficient probably because of the fact that processing to form a gas into plasma is carried out outside of a vacuum chamber and the gas formed into plasma is introduced proximately to the specimen.

The degree of improvement of the etching rate according to this construction is 1.5 to 2 times as fast as a conventional case for instance. This value varies depending on a quality of a material to be etched and so on.

A second problem is that an etching rate is not constant, but a phenomenon in which the etching rate is decreased gradually with the progress of etching is presented frequently.

A third problem is that a material of an ion beam deflection plate or an ion beam retarding grid which is used for radiating only a selected neutral beam generated from an ion beam to a specimen is sputtered and incorporated into the specimen, thus causing metal contamination in semiconductor elements.

In case the material of the electrode or the grid is stainless steel or tungsten, contaminating metal is Fe, Ni, Cr, W and the like, which is not desirable to be introduced into a semiconductor element which is used as a specimen even if a very small amount.

A fourth problem is that, although a neutral beam etching is superior in directional etching, it causes disadvantage frequently. Particularly, it is required to apply etching on a surface provided with steps for accumulating a plurality types of elements and parts of constitute circuits in multilevel structures, but etching residue is liable to be produced along the steps.

It is an object of the present invention to provide a method and an apparatus of etching which solve or reduce four problems in a neutral beam etching technique described above.

SUMMARY OF THE INVENTION

1. Means to solve the first problem

The first problem is improved by having radicals generated in a vacuum chamber, and by extracting electrically neutral particles from these radicals and supplying them to a specimen surface together with a neutral beam.

Incidentally, in a neutral beam etching apparatus which has been developed in the past by the present inventor et al., a halide gas such as $Cl_2$, HCl, $BCl_3$, HF and $NF_3$ is supplied to a specimen surface as it is and made to be adsorbed thereon.

However, sufficient etching rate could not be obtained with these gases as they are because of such a reason that the adsorbed amount was small or the reaction with the surface at the time of adsorption was insufficient.

1.1 Concrete means to solve the first problem 1.1.1 First, radicals are formed in front of the specimen Gas plasma having halogen as a constituent element is generated first in the proximity of (preferably just in front of) the specimen as a concrete means of forming radicals in front of the specimen.

With this, it is possible to generate radicals of high chemical reactivity in a large amount which are formed by dissociation and/or chemical reactions of gas molecules.

1.1.1.1 Effects by forming radicals in front of the specimen

It is possible to increase the etching rate several times and more by generating plasma for forming radicals in the proximity of (preferably just in front of) the specimen.

Since density and chemical activity of radicals generated by plasma are reduced in many cases by colliding with a chamber wall, etc. in general, it is preferable to have plasma for such a purpose generate as proximately to the specimen as possible.

The extent of proximity is different depending on a type of a gas generating plasma, gas pressure, excitation method of plasma, material to be etched and so forth, but it is desirable to be within about 10 cm from a view point of the typical life time (an order of m sec.) of radicals.

1.1.1.2 Additional effect by generating plasma in front of the specimen

In the present invention, it has been found that it shows an advantageous operation to generate plasma for forming plasma in the proximity of the specimen, as follows.

In general, when an ion beam is extracted from plasma, the ion beam is diverged during flight by space charges of positive charges of ions, and the divergence is remarkable particularly in an ion beam of low energy in a degree of several hundred eV employed in the present invention.

As a result, the neutral beam obtained from this ion beam by charge exchange reactions also becomes a divergent beam, and movement directions of particles are distributed and the beam density is reduced at the same time.

In order to suppress such divergence, it is only required to neutralize positive space charges included in ions by means of electrons, and a method of effecting such neutralization by thermal electrons, etc. supplied from a hot filament is known.

The plasma for supplying radicals of the present invention is generated within the ion-beam path, however, since electrons of high density exist in plasma, an effect that these electrons neutralize space charges of the ion beam is obtained.

As the result, it has been found that, when plasma for supplying the radicals is generated, densities of an ion beam and a neutral beam in the specimen portion approximately 10 cm apart from the ion beam extracting electrode increase to 1.2 to 2 times as high as a case when the plasma is not generated.

As described above, the method of suppressing divergence of an ion beam by a space charge effect by generating plasma within the ion-beam path can be applied to an optional charged particle beam, and it is also possible to suppress divergence of a beam by neutralizing space charges with positive ions in plasma.

This method is applicable to a technique of carrying out surface treatment such as etching and film growth while irradiating the specimen with an electron beam and a negative ion beam.

1.1.1.3 Concrete means of generating plasma

As a means of generating plasma, a window for microwave power input is provided on a sidewall of a vacuum chamber, and plasma is generated by supplying microwave with a wave-guide.

As described above, it is possible to generate a large quantity of radicals by introducing microwave from a sidewall of a vacuum chamber into the vacuum chamber and forming a reactive gas containing halogen, etc. which is located in the proximity of the specimen into plasma.

It is possible to increase the etching rate by a large margin by supplying radicals to the specimen surface along with a neutral beam.

1.1.1.3.1 It is preferable to provide a plurality of microwave supply windows

At this time, one piece of plasma source will suffice but it is preferred to install the microwave supply windows in a plurality of units or in ring structure on the sidewall of the vacuum chamber in order to supply radicals uniformly with respect to the specimen surface.

1 1.1.1.3.1.1 Problems of single microwave supply window

A single plasma source has been heretofore employed principally in a plasma etching apparatus which has been used in a manufacturing process of semiconductor integrated circuits and the like. This is because of such a reason that etching uniformity can be secured comparatively easily even in the case of a specimen having a large diameter because of a simple construction of exposing the specimen directly to plasma.

Since it is required to supply both a neutral beam generated from a first plasma source and neutral radicals generated from a second plasma source to a specimen surface in a neutral beam etching method of the present invention, such a new problem to attain etching uniformity which did not exist in a conventional plasma etching apparatus has arisen in order to supply the neutral radicals from the second plasma source uniformly to the specimen surface having a large diameter.

As a result, it has become necessary to install plasma sources for supplying radicals in a plurality of units or in ring structure as described above.

Incidentally, a method of supplying microwave to a sidewall of a vacuum chamber of an etching apparatus as described above can achieve an object of the present invention to increase the etching rate remarkably by supplying radicals of high density. However, this method also has problems to be solved, which will be described later.

1.1.1.3.2 Plasma generating means other than microwave

Incidentally, excitation of plasma for supplying radicals is not limited to microwave, but may be realized by supplying rf power at several hundred KHz to several ten MHz. In order to generate radicals of higher density, however, it is preferred to supply microwave.

1.1.1.4 Radical supply source other than plasma

The supply of radicals utilizing plasma has been described above, but it is also possible to achieve the same object by means of ultraviolet light or laser light. That is, radicals are formed by excitation or dissociation by photo-absorption of gas molecules.

In this case, plasma of high density is not generated just in front of the specimen. Therefore, it becomes easy to prevent charged particles from being incident on the specimen surface, but effect of etching reaction enhancement is little because formed radical quantity is small.

1.1.2 Next, charged particles are prevented from being incident on the specimen surface Next, in order to extract electrically neutral particles out of formed radicals and supply them to the specimen surface together with a neutral beam, it is only required to provide means for preventing charged particles in the plasma which generate radicals from being incident on the specimen surface.

With this, it is possible to supply electrically neutral particles only to the specimen among radicals of high chemical activity which have been generated in a large amount by plasma generation.

Besides, this means also serves to retard a residual ion beam which remains after converting an ion beam into a neutral beam by charge exchange reactions. Further, even when an ion beam is neutralized through charge exchange reactions, it is not necessarily converted into a neutral beam completely, but ions remain. Thus, strictly speaking, an ion beam after charge exchange in the present invention becomes a mixed beam of an ion beam and a neutral beam.

1.1.2.1 The retarding means is a grid system

It is considered to use a grid system and dispose this grid system in the proximity of (preferably just in front of) the specimen as a means for preventing charged particles in radicals from being incident on the specimen surface.

In this grid system, a positive voltage and a negative voltage are applied to two grids, respectively, thereby to retard proceeding of charged particles and extract neutral particles so as to supply them to the specimen.

This grid system is composed of 4 grids for aiming at more perfection, but may also be composed of two to three grids for simplicity's sake.

When the grid system is composed of two grids, a negative voltage is applied to a grid which is closer to plasma, and a positive voltage is applied to a grid which is farther therefrom. With this, it is possible to prevent positively charged particles, i.e., positive ions from proceeding to the rear of the grids.

However, it is not always sufficient with two grids to prevent proceeding of negative charged particles, i.e., electrons and negative ions. Because, since a space potential varies continuously and gradually toward a sidewall of a chamber at ground potential from the grid applied with a negative voltage, it happens sometimes that electrons generated in plasma and so on just in front of the grids pass through the grid system toward the location where the specimen i installed by being accelerated by the grid potential applied with a positive voltage in the rear. In order to check it, it is recommended to provide a grid at ground potential just in front of a grid applied with a negative voltage so as to check proceeding of negative charged particles by an electric field between both grids. To be more complete, it is further recommended to also provide a grid at ground potential just in the rear of a grid applied with a positive potential so that secondary electrons generated from the specimen surface, etc. are not accelerated by a grid at a positive potential.

Accordingly, a ground potential or a negative voltage about $-10$ to $-50$ V is applied to a grid which is farthest from plasma among 4 grids. In such a manner, it is possible to prevent positive and negative charged particles existing in front of the grid system from being incident on the specimen.

Incidentally, it is desirable that a mesh of the grid which is in contact with plasma of a grid system composed of 3 to 4 grids is sufficiently fine. Hence, it is desirable that the size of a mesh is typically at the width of an ion sheath of plasma, i.e., 0.1 to 0.5 mm and less. However, there is an effect of preventing almost all charged particles practically if the size of the mesh is at 1 mm and less.

A grid composed of carbon or silicon having such a fine mesh is not known. A manufacturing method, etc. thereof will be described later.

2. Means to solve the second problem

The second problem can be improved by providing means for maintaining temperatures of a specimen surface and a gas supplied to the specimen surface at predetermined values.

Further, it is considered that the variation of a temperature of a gas supplied to the specimen surface mainly depends on the variation of the temperature of the sidewall of the vacuum chamber.

As a concrete technique for the above, it is considered to provide means for maintaining the specimen surface temperature and the temperature of the sidewall of the vacuum chamber at predetermined values (predetermined constant values). To be concrete, it is only required to install heating means such as a heater, cooling means such as cooling means by water, temperature measurement means such as a thermocouple, and temperature control means for maintaining the temperature on the specimen surface and the temperature of the sidewall of the vacuum chamber at predetermined values (predetermined constant values), respectively, by combining those means organically on an apparatus for surface treatment according to the present invention.

Incidentally, these have been invented based on such views of the present inventor et al. that the variation of the effective supply rate of gas molecules containing halogen to the specimen surface depends principally on the variation of the temperature of the specimen surface and the temperature of the sidewall of the vacuum chamber, and that such variation is particularly conspicuous when plasma for supplying radicals is generated as described above.

In particular, it has such effects that adsorption of radicals onto the surface is increased and the etching speed is also increased to maintain the temperature of the specimen at a low temperature of about −100° C. In order to maintain such a low temperature, it is generally required to use a cooling material such as liquid nitrogen.

Further, it has also such an effect that damages introduced near the interface between an insulating film and a semiconductor to carry out etching of the specimen at a low temperature.

The foregoing is exactly the same as described in the U.S. patent application No. 07/552119 assigned to the same assignee as the present application and filed on Jul. 13, 1990 and JP-A-1-180321 which is the basis of declaration of priority of the application, but the gist thereof is as follows.

Namely, damages introduced near the interface between the insulating film and the semiconductor are originated from the facts that positive holes generated on a surface when charged particles and ionizing radiation such as photons of high energy are incident on the surface move near the interface and trapped there, and dangling bond is formed by breaking chemical bond at the interface. At this time, a process in which positive holes generated on the surface move in an insulating film, i.e., a $SiO_2$ film in the case of a Si MOS transistor is indispensable.

The mobility of positive holes is very small at a temperature of about −100° C. and smaller by several figures and more as compared with a case at the room temperature, and positive holes are fixed in the surface layer which has grown essentially and become unmovable. Thus, generation of damages near the interface between the insulating film and the semiconductor can be suppressed by holding the specimen at a low temperature during etching treatment.

The above is the mechanism which the present inventor is thinking on the causes of suppressing occurrence of damages by holding the specimen at a low temperature.

3. Means to solve the third problem

Next, the third problem, i.e., contamination of the specimen caused by the grid for checking charged particles is due to the fact that the grid material is a metal such as tungsten, nickel and stainless steel.

Thus, it is only required that grids are manufactured of such a material that exerts no bad influence upon the specimen even if the grid material is mixed into the specimen.

Accordingly, it is recommended to use grids composed of a material such as silicon and carbon that exerts no influence upon semiconductor element characteristics in case the specimen is for semiconductor elements.

4. Means to solve the fourth problem

Lastly, the fourth problem exists in that etching residue 96 is liable to be produced frequently at locations along steps 92 on the specimen surface as shown in FIG. 1 because a neutral beam etching is superior in directional etching.

As to such a point, it is effectual to have an incident direction of a neutral beam 101 inclined from a direction 104 normal to the specimen surface and rotate a specimen 102. With this, the steps of the specimen surface are irradiated effectually with the neutral beam, and an operation to proceed with etching of particularly sidewall portions of the steps is effected. Furthermore, expected effects can be realized on all the steps on the specimen surface by rotating the specimen after having the specimen inclined because each of side faces of the steps faces on an optional direction in general.

By such a method, it is possible to reduce etching residue by a large margin at the steps on the specimen surface.

Besides, this method cannot be realized with conventional plasma etching. Because, in plasma etching, the plasma and the specimen are in contact with each other, and ions in the plasma are accelerated by the ion sheath electric field formed normal to the specimen surface, and hence it is impossible to control the incident angle of ions on the specimen surface optionally.

Accordingly, it may be affirmed that the neutral beam etching method is superior to conventional plasma etching also in a point that the incident angle can be controlled freely.

DESCRIPTION OF THE PREFERRED EMBODIMENTS

The present invention will be described in detail hereinafter with reference to embodiments.

1. Embodiment 1

1.1 Composition

Figure 3:
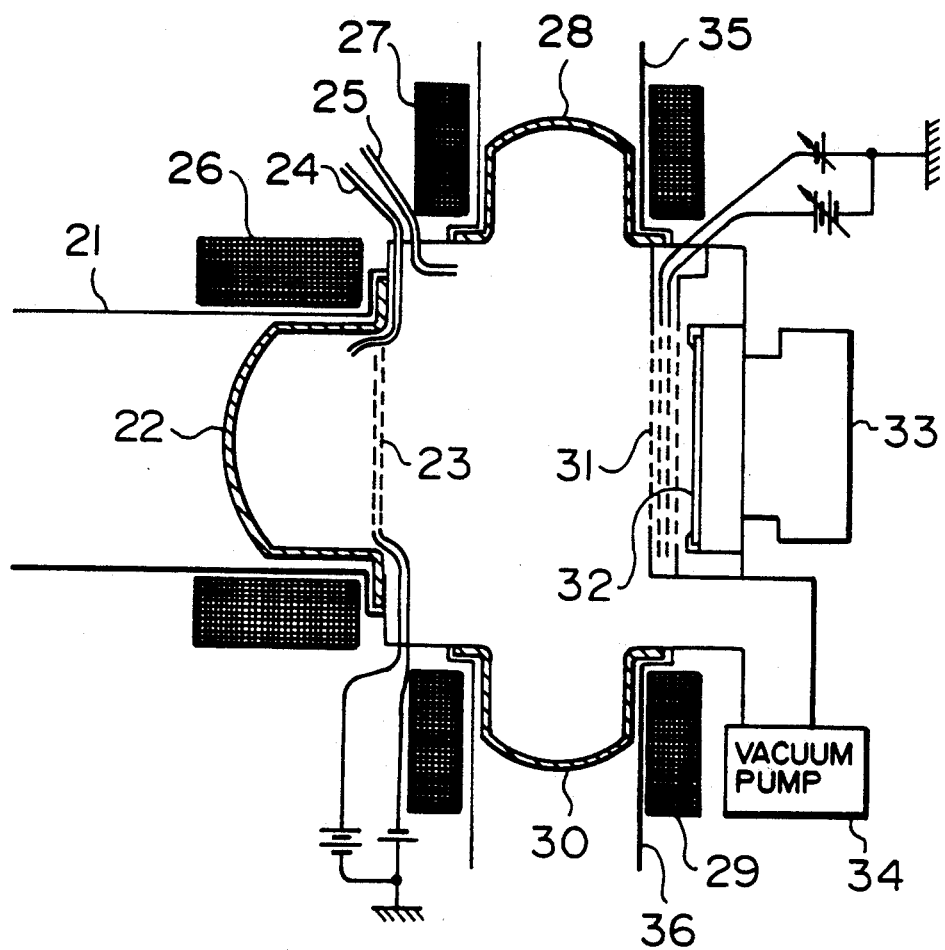
FIG. 3 shows the whole construction of a neutral beam etching apparatus according to the present invention.

A neutral beam etching apparatus in FIG. 3 is composed of a discharge tube 22 which generates plasma for extracting an ion beam, two plates of graphite multiaperture electrodes 23 for extracting an ion beam, a waveguide 21 for supplying microwave power, a solenoid 26 for generating a magnetic field in a discharge tube region, a gas supply tube 24, discharge tubes 28 and 30 for producing radicals, wave-guides 35 and 36 for supplying microwave power, solenoids 27 and 29 for generating a magnetic field in the discharge tube region, a set of grids 31 which prevent charged particles from being incident on specimen 32 to be etched, a gas supply tube 25 for generating radicals, a device 33 for controlling specimen temperature and a vacuum pump 34.

1.2 Merits of providing a plurality of plasma sources for generating radicals.

In the present embodiment, two sets of plasma sources for generating radicals are provided, which have an object to supply radicals uniformly in the specimen. It is effectual to provide further a plurality of plasma sources for effecting such an object, but sufficient uniformity can be realized with one set of plasma source only when the specimen is small.

An ion beam having energy of several hundred eV which is extracted through the multiaperture electrodes 23 is converted into a neutral beam at a fair rate by charge exchange reactions with background gas molecules until it reaches a charged particle retarding grid system 31, and a residual ion beam is checked by the operation of the charged particle retarding grid system. Thus, the neutral beam is incident on the specimen surface.

At this time, a gas for obtaining a neutral beam may be of any type, but it is more preferable to use a rare gas such as Ne, Ar, Kr and Xe which has a comparatively large charge exchange sectional area in a low ion energy region at several hundred eV and lower for obtaining a neutral beam of high density. Such an optional gas is supplied into the discharge tube 22 from the gas supply tube 24.

Only neutral radicals pass through the charged particle retarding grid system 31 and reach the specimen surface from the plasma generated in discharge tubes 28 and 30.

1.3 Description of the structure of multiaperture electrode for extracting an ion beam Here, the structure of a multiaperture electrode for extracting an ion beam of the present invention for generating a neutral beam of high density will be described.

Figure 4A:
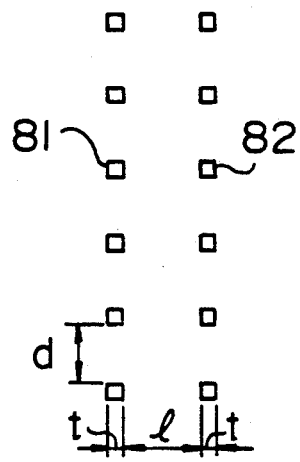
FIGS. 4a–4d show multiaperture electrodes for extracting an ion beam according to the present invention.

It is usually carried out with two plates of multiaperture electrodes to extract an ion beam of low energy from plasma, but those that have equal sectional configurations as shown in FIG. 4a are used in many cases.

Metal or graphite is used normally as an electrode material, and a plurality of apertures each having a diameter d are arranged regularly. Two plates of multiaperture electrodes are usually installed at an interval l which satisfies the relationship $l \geq d$. Because, if the distance between two plates of multiaperture electrodes is narrow to show $l \geq d$, parallelism of equipotential surfaces between both electrodes is very poor, divergence of the extracted ion beam is large, and dispersion of energy of ions is also large.

Figure 4B:
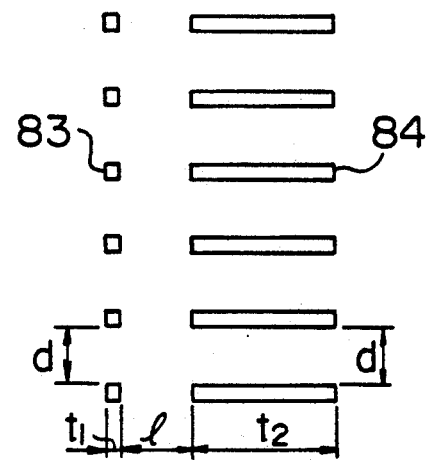
Figure 4C:
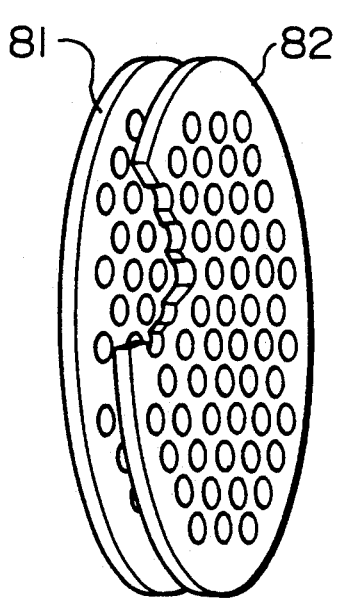
Figure 4D:
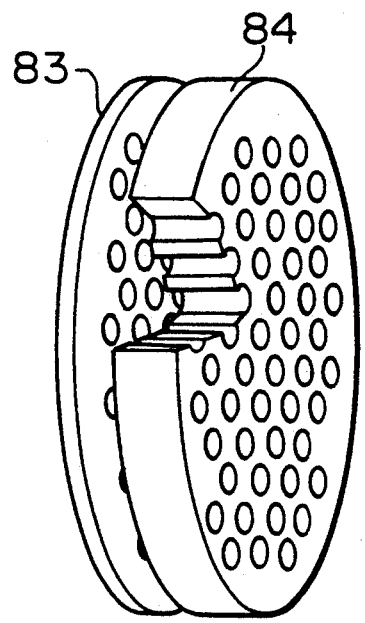

A multiaperture electrode of the present invention is characterized in that the thickness of a multiaperture electrode 84 installed on a downstream side of an ion beam flow is made two times and more as large as the diameter d of the aperture as shown in FIG. 4b.

Typical values of dimensions of respective parts are $d = 0.8$, $l = 1.0$, $t_1 = 0.5$ and $t_2 = 3.0$ in the unit of mm, respectively.

It has been found as a result of experiments by the present inventor that there is an effect of increasing the efficiency of neutralizing ions by forming the aperture on the downstream side in a slender configuration as stated above.

Thus, it is finally possible to increase the density of a neutral beam and increase the etching rate.

Typical voltages applied to multiaperture electrodes for extracting an ion beam are $+200$ to $+600$ V for the multiaperture electrode on the discharge tube side, and $-30$ to $-100$ V for another multiaperture electrode.

Further, voltages at 0 V (ground potential), $-40$ to $-100$ V, voltage higher than the voltage corresponding to ion energy by 50–150 V and 0 V are applied in order to four pieces of charged particle retarding grid system 31 starting from a grid located on the ion source side, respectively.

Incidentally, it is possible to control the energy of the neutral beam employed for etching at 1 Kev and below in a sense that generation of defects attended upon impact by particles to the surface is suppressed, but it is more preferable to control the energy at 500 eV and below.

If this energy is high, the voltage to be applied to charged particle retarding grids for retarding residual ion beams becomes higher accordingly, and danger of spark discharge near the grids is increased. Hence, it is preferable that the kinetic energy of the neutral beam is at 500 eV and below from such a viewpoint, too.

1.4 Examples of grid construction

Next, a construction of grids employed in a neutral beam etching apparatus of the present invention and so forth will be explained.

1.4.1 A first example of grid construction

In FIG. 5, a carbon film 111 is grown in the thickness of several $\mu$m to ten and several $\mu$m by plasma chemical vapor deposition (plasma CVD) using well-known methane gas plasma and the like on a silicon substrate 110.

Figure 5A:
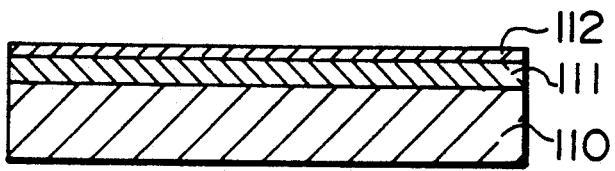
FIGS. 5a–5d show a manufacturing process of grids used in a neutral beam etching apparatus of the present invention.

Then, an $SiO_2$ film 112 having the thickness of about 1 $\mu$m is formed thereon by a sputtering method (FIG. 5a).

Figure 5B:
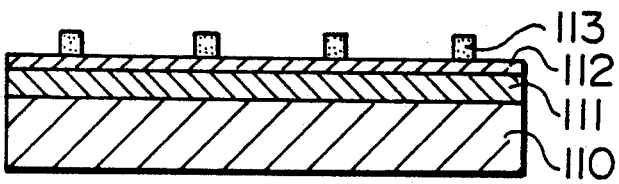

Furthermore, a photoresist mesh-pattern 113 having a line width of 20 $\mu$m and a line space of 200 $\mu$m is further formed thereon through an ordinary photolithography process (FIG. 5b).

Figure 5C:
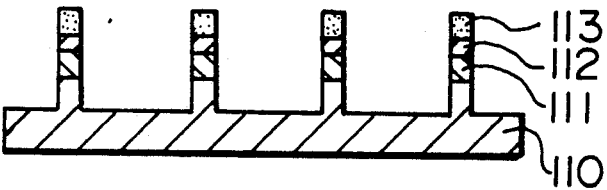

The specimen thus obtained is applied with etching in order of $SiO_2$ film, carbon film and silicon substrate as shown in FIG. 5c using appropriate reaction gas plasma, respectively, using a plasma etching apparatus.

As to the silicon substrate, etching is stopped after etching down to the depth of 100 to 150 $\mu$m.

Thereafter, the photoresist and $SiO_2$ are removed, complete etching is proceeded from the underside of the silicon substrate leaving a peripheral portion of the substrate, and etching is stopped when a mesh pattern on a surface side is reached.

Figure 5D:

In such a manner, a mesh grid composed of two layers of carbon and silicon as shown in FIG. 5d can be formed.

Since this grid has carbon of slow sputtering and etching rate as an upper layer, it has such features of less abrasion and long life time and holding mechanical strength as a grid with silicon in the lower layer. Besides, a silicon carbide film may be used in place of the $SiO_2$ film 112 in the forming method of the grid.

1.4.2 A second example of grid construction

Another method of the present invention for forming carbon grids for retarding charged particles is as follows.

Figure 6A:
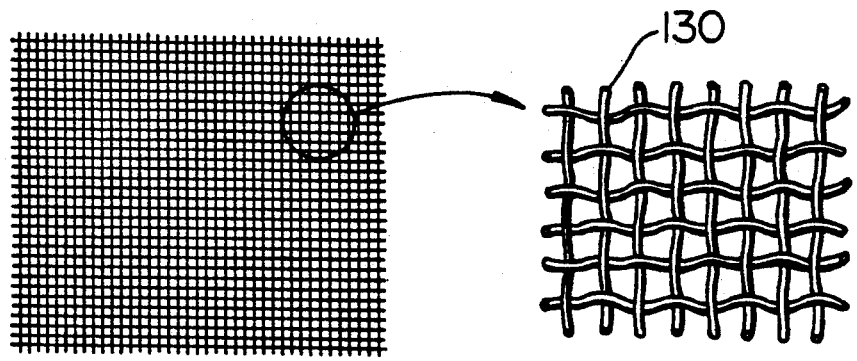
FIGS. 6a and 6b show the construction of a grid electrode used in a neutral beam etching apparatus of the present invention.
Figure 6B:
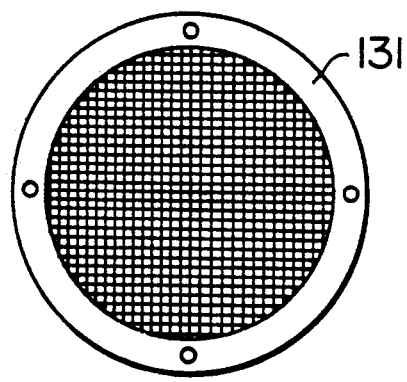

As shown in FIG. 6, fibers 130 each having a diameter of 10-20 $\mu$m with pitch, polyester and the like as the material are knitted first in a mesh form in a desired texture, typically so as to show a distance at 0.5 to 1.0 mm between fibers.

Then, when this mesh is heated at a high temperature in vacuum or in inert gas atmosphere such as argon and the like using an electric furnace, carbonization of fibers is proceeded and a mesh composed of carbon fibers having carbon as the principal component can be formed.

This mesh is fixed on a graphite holder 131 so as to obtain a grid such as shown in FIG. 6. Furthermore, a plurality of these grids are put one upon another, and desired voltage is applied thereto respectively, thereby to have them function as a charged particle retarding grid system.

Moreover, a similar carbon grid may also be formed by knitting preformed carbon fibers in a mesh form.

Incidentally, fabrics formed of carbon fibers are well known and are used for reinforcement materials and other uses. However, there has been no case in which carbon fibers knitted in a mesh form are used as a charged particle retarding grid.

Any mesh composed of carbon fibers as described above has never been manufactured so far. It is apparent from above description that such a mesh has been found very effectual for an object of the present invention as the result of trial production and use by the present inventor et al.

1.4.4 A third example of grid construction

Still another method of the present invention having an object of retarding charged particles is to replace a part of a plurality of grids with a comb-type deflection plate.

Figure 7A:
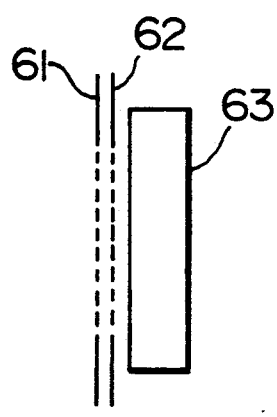
FIGS. 7a–7c show another construction of charged particle retarding means used in a neutral beam etching apparatus of the present invention.
Figure 7B:
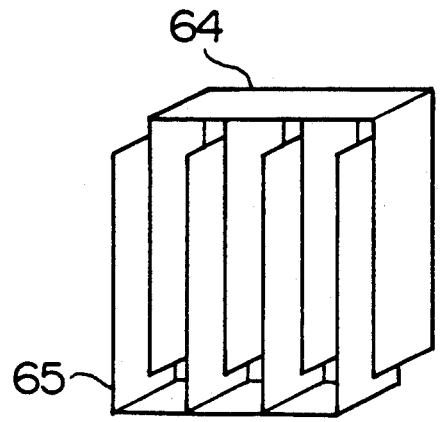
Figure 7C:
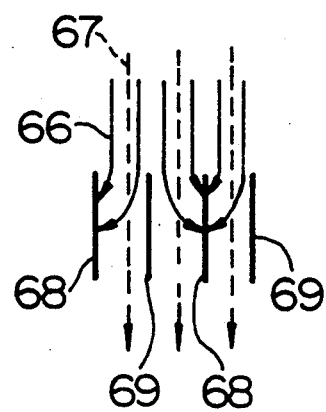

FIG. 7b shows a sketch of a comb-type deflection plate, in which a positive voltage and a negative voltage are applied to comb-type deflection plates 64 and 65 forming one set with two pieces which are arranged in a nest, respectively, for use.

As a sectional view shown in FIG. 7a, two pieces of grids 61 and 62 are arranged in front of a comb-type deflection plate 63, viz., in a direction toward an ion source, and ground potential is applied to the grid 61 and a negative voltage is applied to the grid 62, thereby to check incidence of electrons from plasma. Those ions that have positive charges are deflected by the comb-type deflection plate 63 and are lost after being incident on the surface of the deflection plate.

In this manner, it is possible to suppress decrease of particle beam density due to employment of a plurality of fine mesh grids by replacing a part of grids with a comb-type deflection plate.

Besides, either grid is etched gradually since a neutral beam collides therewith. Therefore, it is required to replace the grids with new ones periodically in order to maintain predetermined functions.

It is disadvantageous to expose an etching apparatus to the atmosphere as often as replacing operations in such points that the stability of etching characteristics is ruined, the operative efficiency is lowered and so on.

Accordingly, it is desirable that a cassette including a plurality of required grids formed in one body is formed and new and old cassettes are exchanged for each other by movement from a preparation chamber.

1.5 Embodiments of etching

An embodiment in which $SiO_2$ on a silicon substrate having a photoresist mask pattern is etched using an apparatus constructed as described above will be described.

An Ar gas was introduced into the discharge tube 22 at a pressure of $8 \times 10^{-4}$ Torr, plasma was generated by supplying microwave power at 200 W, and an Ar positive ion beam at 500 eV was extracted therefrom. The current density of the ion beam was 0.5 mA/cm$^2$.

This ion beam was converted into a neutral beam by approximately half until it reached a charged particle retarding electrode 31 which was apart from a multiaperture electrode 23 by 13 cm.

Furthermore, a $CHF_3$ gas was introduced at a partial pressure of $5 \times 10^{-4}$ Torr from the gas supply tube 25, and plasma was generated by discharge tubes 28 and 30. It was found at that time that the ion beam current density and the neutral beam density increased 1.2 to 1.5 times as large as before due to generation of the plasma.

The etching rate of $SiO_2$ was approximately 8 nm/min when plasma was not generated by the discharge tubes 28 and 30, but it increased to approximately 80 nm/min when plasma was generated. In the case of the latter, the etching rate for silicon was approximately 10 nm/min, and the etching selective ratio for silicon was 8.

As a result of observation on a cross-section of the etched pattern with a scanning electron microscope, it was confirmed that etching had been proceeded in the incident direction of the neutral beam and that very fine linear pattern having a pattern width of approximately 0.2 μm could be formed in a rectangular sectional configuration. Besides, the temperature was controlled at −50° C. by cooling a specimen rest in carrying out etching.

Next a case in which silicon was etched using the same apparatus will be described.

A gas obtained by mixing $SF_6$ and $Cl_2$ at a ratio of 3:1 was introduced from the gas supply tube 25 in place of the $CHF_3$ gas mentioned above so as to show a pressure at $6 \times 10^*(-4)$ Torr, thereby to generate plasma in the discharge tubes 28 and 30.

The same state as the above was maintained except that the kinetic energy of the ion beam was set at 150 eV, and a neutral beam and neutral radicals were supplied to the specimen surface so as to apply etching to a silicon film having a photoresist mask pattern. The etching rate for silicon was 100 to 150 nm/min. This etching rate is about six times as fast as that in a case when plasma is not generated in the discharge tubes 28 and 30. It was confirmed that the etched cross-sectional configuration was rectangular and etching could be made perpendicularly.

In both cases described above, current to voltage characteristics of a metal/$SiO_2$ film/silicon (MOS) capacitor which had been formed on a silicon substrate in advance showed no change by etching treatment, and degradation of dielectric strength of a thin $SiO_2$ film having the thickness of 5 nm was not generated.

In a neutral beam etching apparatus of the present invention, the charged particle retarding grid 31 is a grid made of carbon fibers formed by a method explained previously or having a two layer structure of carbon and silicon. The obtained etching characteristics were the same in the cases when either grid was used.

In order to make the density of the neutral beam radiated to the specimen as high as possible, it is preferable to have a numerical aperture of the grid as large as possible. Accordingly, a grid having a numerical aperture of 75% and above per one piece of grid was manufactured to be put to use.

1.6 Problems of a neutral beam etching apparatus using a non-coaxial type ion beam and radical source As described above, a method of supplying microwave to a sidewall of a vacuum chamber of an etching apparatus can achieve the original object of increasing etching rate remarkably by supplying radicals of high density, but has two problems as follows.

1.6.1 Problem 1

A first problem is the increase in manufacturing cost of the apparatus due to the fact that a plasma source for radical supply is provided separately from the ion beam source.

Usually, a microwave generator, a wave-guide, a discharge tube, a magnetic field generator for operating cyclotron motion of electrons and so forth are required in order to generate plasma with microwave. However, if it is possible to use a part or the whole of these units commonly with a plasma generator for an ion beam source, the manufacturing cost of the apparatus may be curtailed by that portion.

1.6.2 Problem 2

A second drawback is such that, when a unit for generating microwave plasma is provided on a sidewall of a vacuum chamber, a direction of required magnetic field takes a direction normal to or close to normal to the direction of an ion beam and a neutral beam, and thus, a path of an ion beam before neutralized by charge exchange is bent by Lorentz force.

As a result, the beam direction diverges, thus lowering the etching rate or harming the etching direction.

1.7 Proposal for a neutral beam etching apparatus using a coaxial type ion-beam and radical source In order to solve these two drawbacks at the same time, a neutral beam etching apparatus using a "coaxial type ion-beam and radical source" in which the apparatus construction is further improved is proposed as follows.

2. Embodiment 2

2.1 Construction

Figure 8:
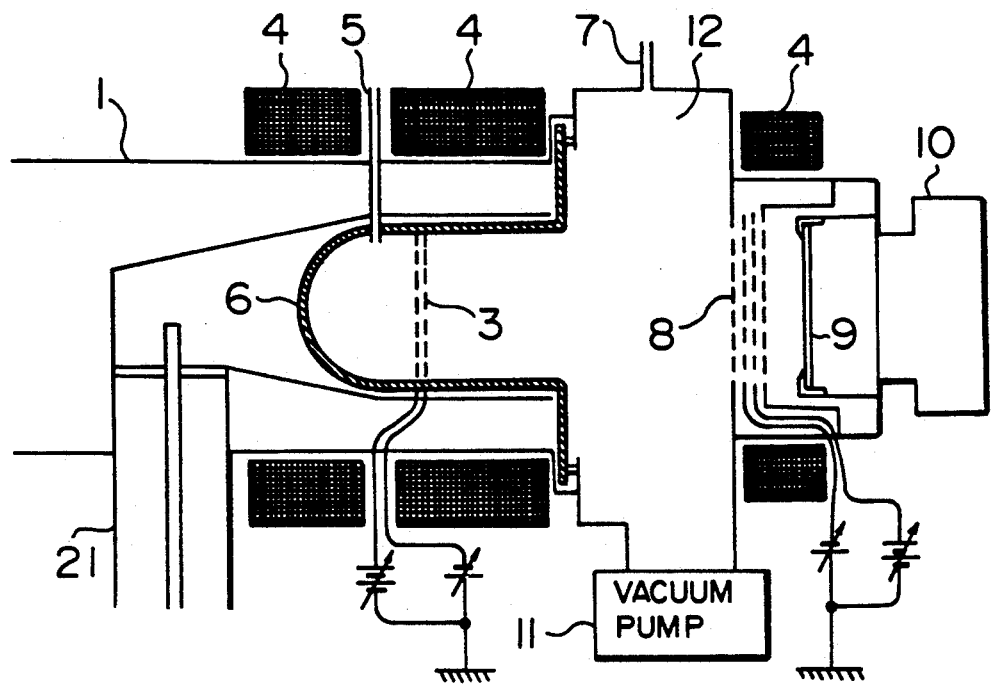
FIG. 8 shows the whole construction of a neutral beam etching apparatus of the present invention using a coaxial type ion beam radical source of a first type.

FIG. 8 shows an embodiment of a neutral beam etching apparatus using a coaxial type ion-beam and radical source according to the present invention.

In the figure, a coaxial ion-beam and radical source includes a first wave-guide 1 and a second wave-guide 2. These two wave-guides have a coaxial type double structure starting on the way, and microwave is supplied to each of them independently.

The etching apparatus shown in the figure consists of a discharge tube 6, a set of solenoids 4 arranged coaxially, a multiaperture electrode 3 for extracting an ion beam, gas supply pipes 5 and 7, a set of charged particle retarding grids 8, a device 10 for controlling the temperature of a specimen 9 and an evacuation device 11 in addition to those wave-guides.

The differences from the apparatus in the embodiment 1 exist in that a set of solenoids 4 are arranged coaxially, that a plasma generating region for supplying radicals is provided in the peripheral portion of the discharge tube 6 for extracting an ion beam, and that wave-guides for microwaves supplied to both are formed into a duplex tube and microwave power is supplied to each of them independently. This is referred to as a "coaxial type ion-beam and radical source" in the present invention.

Besides, it is required to have an ion beam make a flight for a certain distance (for example, 10 cm and more) in order to convert an ion beam into a neutral beam.

On the other side, it is preferable to generate plasma in a space within 10 cm as near to the specimen as possible in order to supply radicals to the specimen efficiently. Therefore, the multiaperture electrode 3 for extracting an ion beam was installed at a position farther from the specimen than a generating region 12 of plasma for supplying radicals as shown in FIG. 8.

At the point of the second wave-guide 2 is installed the discharge tube 6 which is composed of a dielectric such as quartz and alumina, and plasma is generated therein.

A positive voltage and a negative voltage are applied to two plates of multiaperture electrodes 3, respectively, whereby an ion beam at desired energy can be extracted from the plasma.

The microwave supplied to the first wave-guide 1 serves to generate plasma in a chamber 12 in front of the specimen 9.

2.2 Effects

With the construction described above, it is possible to generate plasma for generating an ion beam and plasma for supplying radicals with a magnetic field produced by a group of electromagnets 4, and it is not necessary to install electromagnet group for respective plasmas individually.

Furthermore, since the magnetic field produced by a group of electromagnets 4 can be made almost parallel to the direction of an ion beam extracted from the multiaperture electrode 3, the ion beam before neutralization will never be deflected largely by means of the magnetic field.

In the apparatus construction of the present embodiment, it is possible to reduce the quantity of solenoids, DC power sources which supply current thereto and discharge tubes, thus curtailing the manufacturing cost of the apparatus.

The usage and the arrangement of the apparatus of the present embodiment are similar to those of the embodiment 1, and similar etching characteristics are also obtainable.

3. Embodiment 3

3.1 Construction

Figure 9:
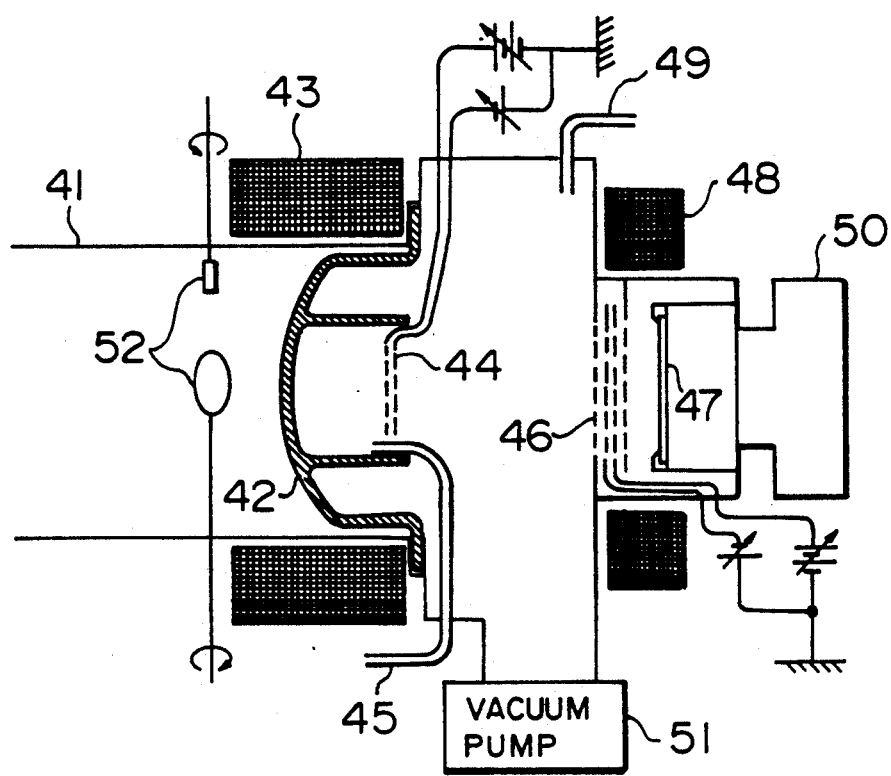
FIG. 9 shows the whole construction of a neutral beam etching apparatus of the present invention using a coaxial type ion beam radical source of a second type.

A second type of coaxial type plasma source supplies microwave which generates both plasma for forming an ion beam and plasma for supplying radicals with a single wave-guide 41 as shown in FIG. 9.

In this type, a discharge tube 42 is divided into the inner part and the outer part, and a multiaperture electrode 44 which extracts an ion beam is installed in the inner part portion. The outer part portion is a region for generating plasma for supplying radicals.

3.2 Effects

In this type of coaxial type plasma source, a group of electromagnets 43 and 48, a single wave-guide 41 and a set of microwave generator will suffice, thus making it possible to curtail the manufacturing cost of the apparatus by a large margin.

The first type is excellent in such a point that the microwave intensity supplied to plasma sources of both microwave attenuators can be controlled independently, but the microwave intensity can be controlled to some extent by providing a microwave attenuator in the wave-guide in the second type, too.

4. Embodiment 4

4.1 Construction

The specimen was etched at respective temperatures at 40° C. and below by controlling the specimen temperature in etching using apparatus in the embodiments 1, 2 and 3. The specimen was a silicon wafer for composing a semiconductor integrated circuit including a MOS (metal-oxide semiconductor) capacitor and a MOS transistor.

As the result of evaluation of insulating film characteristics of a MOS structure in point of current-voltage characteristic through an electrode forming process and so on after etching, degradation of breakdown voltage of the insulating film caused by etching has not been detected in any of specimens.

4.2 Effects

In a process in which a gate electrode of a MOS transistor is applied with etching, however, such a tendency that a specimen etched at a lower temperature had a longer life time of a MOS transistor was found when specimens which were etched at respective temperatures as described above were compared one another. In particular, this effect was conspicuous when the specimen temperature during etching was at −100° C. and below, which showed 1.5 to 2 times and more as large as the specimen etched at 40° C.

4.3 Presumption of causes of effects

Here, the life time of a MOS transistor means voltage application time to exceed a certain permissible shift as to a phenomenon in which a threshold voltage of a MOS transistor shifts when a certain voltage is applied for a long time to each of a source, a gate, a drain and a substrate which compose the MOS transistor.

The reason why a specimen etched at a lower temperature has a longer life time is not clear, but it is conjectured to be caused by that positive holes generated in a gate oxide film of a MOS transistor during etching process produce defects to degrade the life time when they reach an oxide-film semiconductor interface, but such movement of positive holes would be suppressed at a low temperature.

5. Embodiment 5

Radical generation using excimer laser light in place of plasma.

Etching of silicon was carried out using the apparatus shown in FIG. 3 in a similar manner as the Embodiment 1.

In the present embodiment, however, a excimer laser light using KrF was radiated to the front of a charged particle retarding electrode through a window on a sidewall of the apparatus instead of generating plasma for supplying neutral radicals, thus exciting molecules of $SF_6 + Cl_2$ gas by laser light. Other conditions were set similarly to those of silicon etching example in the Embodiment 1. The silicon etching rate in the case of no irradiation with laser light, viz., by a neutral beam only was 15–30 m/min, but was increased to 1.5–2 times by irradiation with laser light.

Further, when ultraviolet rays from a Hg lamp are radiated in place of laser light, the silicon etching rate was also increased to about 1.5 times thereof.

In either case, increase of the etching rate is small as compared with a case of generating plasma, but plasma is scarcely generated by irradiation with light. Therefore, there is a merit that the line space of grids of the charged particle retarding grids arranged in front of the specimen may be as large as 1–2 mm because it is only required to retard proceeding of only an ion beam and a few electrons remaining in a neutral beam.

6. Embodiment 6

Figure 2:
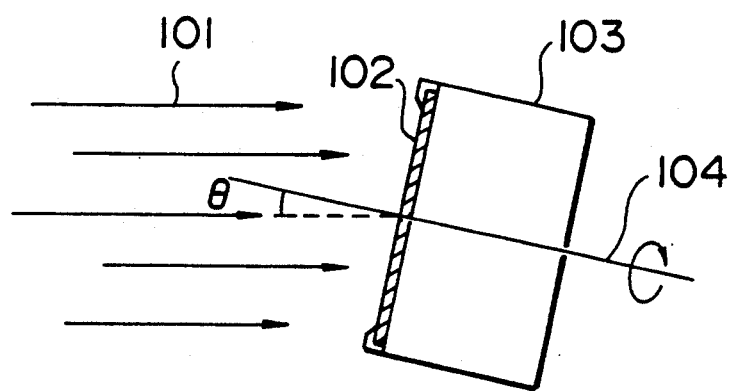
FIG. 2 is a drawing showing an etching method according to the present invention, specifically for showing that the incident angle of a beam is inclined by a predetermined angle $\theta$ from the direction normal to the specimen surface and etching is applied while rotating the specimen while holding such a state.

In neutral beam etching apparatus shown in FIG. 3, FIG. 8 and FIG. 9, a central axis 104 of a specimen rest 103 was inclined by an angle 8 with respect to a direction 101 of a neutral beam as shown in FIG. 2 so that the neutral beam would be incident from a direction with a slight gradient with respect to a direction normal to the specimen surface.

$\theta$ was set at an optional angle between 3° and 15°. At the same time, a function of rotating the specimen rest 103 was added, thereby to rotate the specimen during etching. The rotating speed was set between 10 rpm and 100 rpm.

With the apparatus described above, a polysilicon film formed on a substrate surface having complicated steps was applied with etching according as the case of silicon etching described in Embodiment 1.

Figure 1:
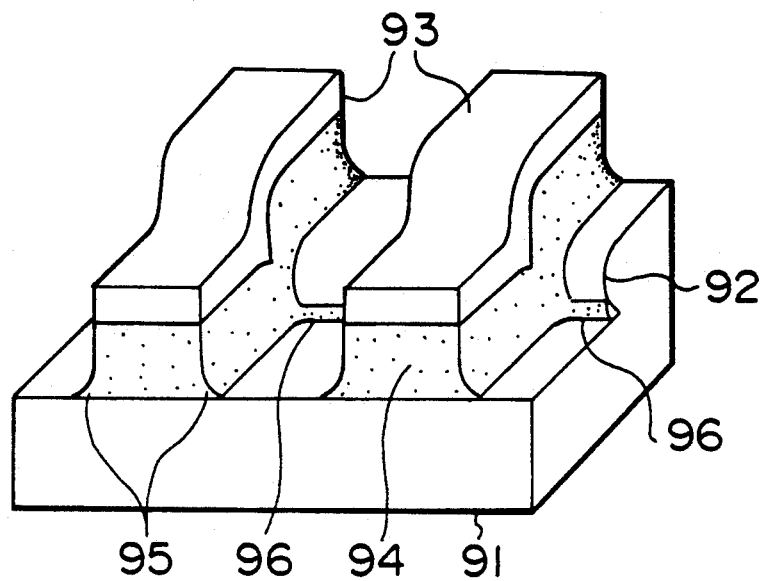
FIG. 1 is a drawing for explaining problems to be solved by the invention, specifically for showing steps generated on the specimen surface etched by a neutral beam etching method.

FIG. 1 is an external view of an etched specimen, in which it is shown that etching residue 96 is produced along a bottom portion of a step portion 92 in polysilicon 94.

As the angle $\theta$ was increased starting from 0°, etching residue 96 was reduced and defects of short-circuits between adjacent line patterns through etching residue 96 were also reduced remarkably. At the same time, tails 95 of pattern sections which appear frequently were also found to decrease with the increase of $\theta$, thus producing an effect of allowing a cross-section of etched pattern to come close to a perfect rectangle.

7. Embodiment 7

An embodiment in which a thin film is deposited on a substrate surface using apparatus shown in FIG. 3, FIG. 8 and FIG. 9 will be described.

In a plasma source which generates a neutral beam of Ar or Kr at 200–300 eV and radicals at the same time in a similar operation to and under similar operating conditions to Embodiment 1 and Embodiment 2, a mixed gas plasma of $SiH_4 + N_2O$ at a pressure of approximately $10^{-3}$ Torr was generated.

An insulating film containing Si and O as principal components has grown by chemical reactions on a surface generated when neutral molecules only in plasma reached the specimen surface. The temperature of the specimen that time was maintained at a constant value between 100° C. and 400° C.

When the neutral beam is emitted during growth of the film, such improvement was noticed in the film quality and the composition of the film, as follows. By means of irradiation of the neutral beam, the film became denser. Further, when composition analysis of the film was made, it was found that hydrogen content in the film was lowered and the composition approached $SiO_2$ in the film irradiated with the neutral beam.

Same effects were obtained by irradiation with an ion beam during growth, but a plurality of defects of low dielectric breakdown voltage were noticed locally in the insulating film obtained in this case. It is considered that defects were generated because electric charges are accumulated on the surface by irradiation with the ion beam. It was found that such defects were generated very scarcely by irradiation with a neutral beam.

Incidentally, the temperature of the specimen while the insulating film is growing is as high as 300°–500° C. in general, which is advantageous for forming a dense and uniform film. In case of simultaneous irradiation with a neutral beam, however, there is a merit that a dense and uniform film can also be formed at a lower temperature of 100°–200° C.

8. Embodiment 8

Figure 10:
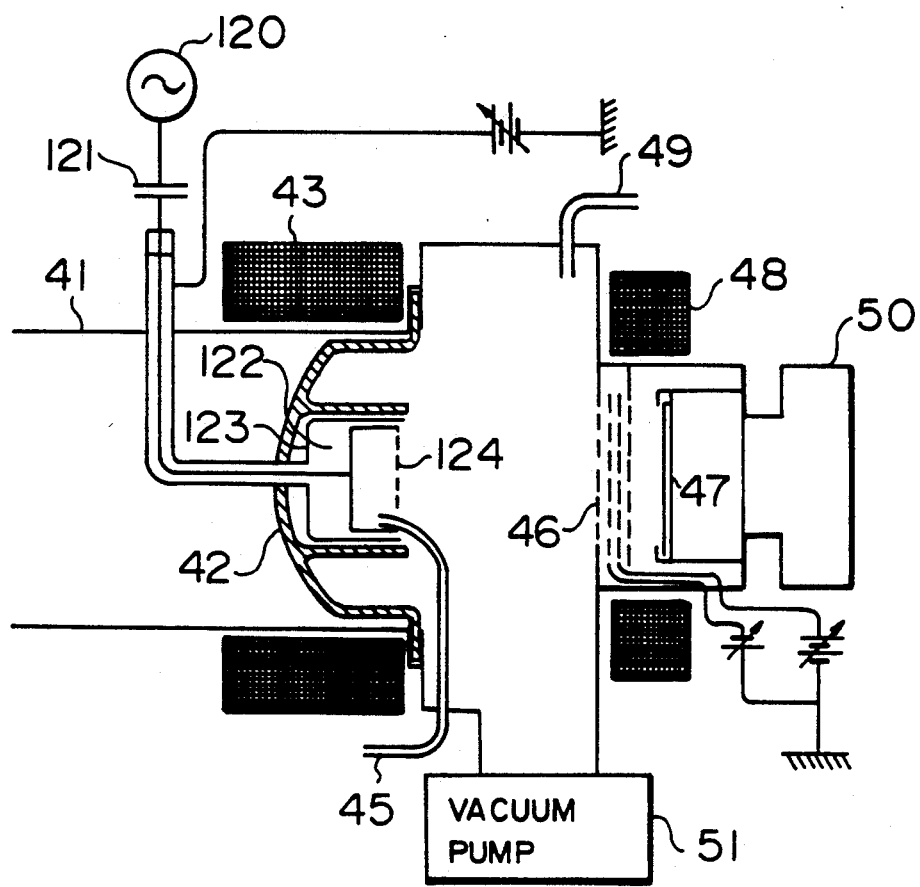
FIG. 10 shows the whole construction of a neutral beam etching apparatus according to the present invention featured in that an ion beam is generated using rf hollow cathode discharge plasma.

A neutral beam etching apparatus shown in FIG. 10 shows an embodiment characterized in that an rf hollow cathode discharge plasma is used in a portion of generating an ion beam in place of a system using microwave excitation plasma shown in FIG. 3, FIG. 8 and FIG. 9.

When a gas is supplied at a pressure of $10^{-3}$ to $10^{-4}$ Torr to an rf hollow cathode 122 through a gas supply tube 45, and an rf power at 13.56 MHz is supplied from an rf power supply 120 through a capacitor 121, rf discharge plasma is generated between an anode 123 and the rf hollow cathode 122, and in particular, plasma of high density is generated in a hollow cathode 122, thus making it possible to generate an ion beam of higher density than that at multiapertures 124 of the hollow cathode 112.

At this time, the kinetic energy of ions in the ion beam can be controlled by a potential applied to the anode, and the higher the positive potential is, the higher the energy of the generated ion beam becomes.

Accordingly, the kinetic energy of neutral particles can also be increased when the ion beam is converted into a neutral beam by charge exchange reactions. Besides, in this system, ions of high density collide with the internal surface of the hollow cathode 122 at a comparatively high energy of several hundred eV. Therefore, the hollow cathode is heated to a very high temperature as well as consumed by etching.

Accordingly, it is preferable that graphite is adopted as the material for the hollow cathode 122 and the multiaperture 124.

According to the present invention, such an effect may be had that new neutral beam etching which dissolves degradation of a thin insulating film by conventional plasma etching can be realized, and in particular, the etching rate is increased.

Further, according to the present invention, it becomes possible to grow a dense and uniform thin film on the specimen surface.

In the circumstances, when an apparatus for surface treatment and a method for the same of the present invention are employed in a manufacturing process of very fine elements such as semiconductor integrated circuits, defects in elements can be decreased remarkably and production yield can be improved, and moreover, the life time of elements can also be improved.

Particularly, in the manufacture of super highly integrated MOS semiconductor devices which have to use a very thin insulating film having the thickness of several $\mu m$ inevitably, the present invention is a very effectual technique in a point that defects such as insulation breakdown and charge accumulation in film of a very thin insulating film scarcely occur.

Further, according to a system composing the present invention, it is possible to curtail the manufacturing cost and the working cost of the apparatus by a large margin by simplifying the structure of an apparatus for surface treatment for etching, deposition and so on using a neutral beam, and also to suppress divergence of the neutral beam, thereby enabling uniform surface treatment.

Furthermore, according to an electrode structure for extracting an ion beam of the present invention, the density of the neutral beam which is finally obtainable can be increased, and the surface treatment speed can also be increased.

Further, when charged particle retarding grids of the present invention are used, contamination by heavy metals such as Fe and Ni will never be produced on the specimen surface.

Moreover, according to the present invention, there is an advantage that defects by short-circuits caused by etching residue which is liable to be produced at steps on the substrate surface can be reduced by a large margin.

We claim:

1. An apparatus for surface treatment, comprising: wave-guides having a duplex structure portion; a first plasma generating region and ion beam generating means for generating an ion beam near one end of an internal wave-guide of said wave-guides; and a second plasma generating region for forming radicals near one end of an external wave-guide of said wave-guides.

2. An apparatus for surface treatment according to claim 1, further comprising means for controlling the temperature of a specimen at a predetermined value.

3. An apparatus for treating a surface of an object, said apparatus comprising:
first means for generating an ion beam within a vessel containing an ion beam source gas at a pressure below atmospheric pressure;
second means for introducing a reactive gas into said vessel and converting the reactive gas into a plasma to produce radicals;
said first means causing the ion beam to pass through a gas atmosphere containing the ion beam source gas and the reactive gas within said vessel to neutralize part of the charged particles in the ion beam and convert the ion beam into a mixed beam containing the ion beam and a neutral beam; and
third means for radiating substantially only the neutral beam onto an object, with charged particles in the mixed beam being substantially prevented from impinging on the object, and for supplying, among the radicals, substantially only neutral radicals to the surface of the object.

4. An apparatus according to claim 3, wherein said first means includes plasma generating means and an ion beam extracting electrode unit.

5. An apparatus according to claim 3, wherein said vessel includes means for supplying microwave electric power to the vessel interior.

6. An apparatus according to claim 3, wherein said vessel includes means for supplying high frequency electric power to the vessel interior.

7. An apparatus according to claim 3, wherein said third means includes first, second, third and fourth plate-like grids arranged substantially in parallel with each other, with a predetermined spacing between adjacent ones of said grids, and with said first and fourth grids respectively being nearest to and farthest from said second means; means for applying ground potential to said first grid; means for applying a negative voltage to said second grid; means for applying a positive voltage to said third grid; and means for applying the ground potential to said fourth grid.

8. An apparatus according to claim 3, wherein said third means includes first and second comb-like deflecting units arrange din a nested structure; means for supplying a positive voltage to said first deflecting unit; and means for supplying a negative voltage to said second deflecting unit.

9. An apparatus according to claim 3, wherein said second means is spaced from the surface of the object by not more than 10 cm.

10. An apparatus according to claim 3, further comprising means for holding the object so that the incident angle of the neutral beam onto the surface of the object is not parallel with the normal to the surface of said object; and means for precession rotating of said holding means.

11. An apparatus according to claim 3, wherein the object is a semiconductor device.

12. An apparatus according to claim 3, wherein said second means includes plasma generating means.

13. An apparatus according to claim 12, wherein said plasma generating means includes a plurality of plasma generators.

14. An apparatus according to claim 12, wherein said plasma generating means is annular plasma generating means on a wall surface of said vessel.

15. An apparatus according to claim 3, wherein said vessel includes waveguide means having a duplex structure portion, and wherein at least a portion of said first means is arranged near one end of an internal waveguide of said duplex structure portion and at least a portion of said second means is arranged near one end of an external waveguide of said duplex structure portion.

16. An apparatus according to claim 15, wherein said first means includes plasma generating means and an ion beam extracting electrode unit.

17. An apparatus according to claim 15, wherein said second means includes plasma generating means.

18. An apparatus according to claim 3, wherein said third means includes a first grid; a second grid further from said second means than said first grid is from said second means; means for supplying a negative voltage to said first grid; and means for supplying a positive voltage to said second grid.

19. An apparatus according to claim 18, wherein said first and second grids are made of carbon fibers.

20. An apparatus according to claim 18, wherein said first and second grids are substantially parallel with each other.

21. An apparatus according to claim 20, wherein said first and second grids are formed in a double layer structure of carbon and silicon.

22. An apparatus according to claim 20, wherein said first and second grids are formed in a double layer structure of silicon carbide and silicon.

23. An apparatus for treating a surface of an object, said apparatus comprising an enclosed vessel having an interior pressure below atmospheric pressure, and a discharge tube assembly within said vessel, said discharge tube assembly including means defining a first discharge space and a second discharge space, said defining means including a wall surface and means for supplying high frequency electric power or microwave electric power to the first discharge space and the second discharge space; means for independently controlling the amount of high frequency electric power or microwave electric power supplied to said first discharge space and to said second discharge space, said first discharge space being arranged to extract an ion beam from which a neutral beam to be radiated onto the object is produced, and said second discharge space being arranged to produce radicals for treating the surface of the object.

24. An apparatus according to claim 23, wherein said second means includes first, second, third and fourth plate-like grids arranged substantially in parallel with each other, with a predetermined spacing between adjacent ones of said grids, with said first and fourth grids, respectively, being nearest to and farthest from said second plasma discharge space; means for applying ground potential to said first grid; means for applying a negative voltage to said second grid; means for applying a positive voltage to said third grid; and means for applying the ground potential to said fourth grid.

25. An apparatus according to claim 23, wherein said second means includes first and second comb-like deflecting units arranged in a nested structure; means for supplying a positive voltage to said first deflecting unit; and means for supplying a negative voltage to said second deflecting unit.

26. An apparatus according to claim 23, wherein said second discharge space is spaced from the surface of the object by not more than 10 cm.

27. An apparatus according to claim 23, further comprising means for holding the object so that the incident angle of the neutral beam onto the surface of the object is not parallel with a normal to the surface of the object; and means for precession rotating said holding means.

28. An apparatus according to claim 23, wherein the object is a semiconductor device.

29. An apparatus according to claim 23, further comprising:
 first means for passing the ion beam through a gas within said vessel to neutralize part of the charged particles of the ion beam and convert the ion beam into a mixed beam of an ion beam and a neutral beam; and
 second means for radiating the neutral beam onto the object, with charged particles in the mixed beam being substantially prevented from impinging on the object, and for supplying, among the radicals, substantially only neutral radicals to the surface of the object.

30. An apparatus according to claim 29, wherein said first and second grids are substantially parallel with each other.

31. An apparatus according to claim 29, wherein said second means includes a first grid; a second grid further from said second discharge space than said first grid is from said discharge space; means for supplying a negative voltage to said first grid; and means for supplying a positive voltage to said second grid.

32. An apparatus according to claim 31, wherein said first and second grids are formed in a double layer structure of carbon and silicon.

33. An apparatus according to claim 31, wherein said first and second grids are formed in a double layer structure of silicon carbide and silicon.

34. An apparatus according to claim 31, wherein said first and second grids are made of carbon fibers.

35. An apparatus for treating a surface of an object in a vessel at a pressure below atmospheric pressure, said apparatus comprising:
 waveguide means within the vessel and having a duplex structure portion;
 first plasma generating means for producing an ion beam;
 ion beam extracting means;
 means arranging said first plasma generating means and said ion beam extracting means near one end of an internal waveguide of said duplex structure portion;
 second plasma generating means for producing radicals;
 means arranging said second plasma generating means near one end of an external waveguide of said duplex structure portion;
 means for passing the ion beam through a gas within the vessel to neutralize part of the charged particles of the ion beam and convert the ion beam to a mixed beam of an ion beam and a neutral beam; and
 means for radiating the neutral beam onto an object, with charged particles in the mixed beam being substantially prevented from impinging on the object, and for supplying, among the radicals, substantially only neutral radicals to the surface of the object.

36. An apparatus according to claim 35, wherein said second means includes first, second, third and fourth plate-like grids arranged substantially in parallel with each other, with a predetermined spacing between adjacent ones of said grids, and with said first and fourth grids, respectively, being nearest to and farthest from said second plasma generating means; means for applying ground potential to said first grid; means for applying a negative voltage to said second grid; means for applying a positive voltage to said third grid; and means for applying the ground potential to said fourth grid.

37. An apparatus according to claim 35, wherein said second means includes first and second comb-like deflecting units arranged in a nested structure; means for supplying a positive voltage to said first deflecting unit; and means for supplying a negative voltage to said second deflecting unit.

38. An apparatus according to claim 35, further comprising means for holding the object so that the incident angle of the neutral beam onto the surface of the object is not parallel with a normal to the surface of the object; and means for precession rotating said holding means.

39. An apparatus according to claim 35, wherein the object is a semiconductor device.

40. An apparatus according to claim 35, wherein said second means includes a first grid; a second grid further from said second plasma generating means than said first grid is from said second plasma generating means; means for supplying a negative voltage to said first grid; and means for supplying a positive voltage to said second grid.

41. An apparatus according to claim 40, wherein said first and second grids are substantially parallel with each other.

42. An apparatus according to claim 40, wherein said first and second grids are formed in a double layer structure of carbon and silicon.

43. An apparatus according to claim 40, wherein said first and second grids are formed in a double layer structure of silicon carbide and silicon.

44. An apparatus according to claim 40, wherein said first and second grids are made of carbon fibers.

45. A method of surface treatment of a specimen, comprising generating a neutral beam within a vacuum chamber; generating radicals, including neutral radicals by forming particles in said vacuum chamber into plasma within said vacuum chamber; holding a specimen so that the specimen surface is oriented in a direction not normal to the direction of the neutral beam; rotating the specimen; and supplying the neutral beam and neutral radicals to the specimen surface.

46. A method of surface treatment according to claim 45, wherein said neutral beam is generated by operating charge exchange reactions with gas molecules on the ion beam which has been extracted from plasma.

47. A method of surface treatment according to claim 45, wherein said plasma is generated in a space within 10 cm of the specimen surface.

48. A method of surface treatment according to one of claims 45 to 47, further comprising maintaining the specimen temperature constant during the surface treatment.

49. A method of surface treatment according to one of claims 45 to 47, wherein a plurality of grids are arranged just in front of the specimen, and voltages are applied to the grids to prevent charged particles from being incident on the specimen surface.

50. A method of surface treatment according to one of claims 45 to 47, wherein rare gas atoms are contained in the particles of said neutral beam.

51. A method of surface treatment according to one of claims 45 to 47, wherein neutral radicals supplied to the specimen surface are generated from a gas containing carbon, fluorine and hydrogen as constituents, and a specimen composed of a material having $SiO_2$ as a principal component is etched.

52. A method of surface treatment according to claim 48, wherein the specimen temperature is held at $-100$ C or below.

53. A method of surface treatment according to one of claims 45 to 47, wherein the energy of said neutral beam is at 500 eV or below.

* * * * *